(12) United States Patent
Go

(10) Patent No.: US 9,373,811 B2
(45) Date of Patent: Jun. 21, 2016

(54) ORGANIC LIGHT-EMITTING DIODE (OLED) DISPLAY PANEL SUBSTRATE AND METHOD OF CUTTING OLED DISPLAY PANELS FROM THE SUBSTRATE

(71) Applicant: Samsung Display Co., Ltd., Yongin, Gyeonggi-Do (KR)

(72) Inventor: Jae Kyung Go, Asan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/327,229

(22) Filed: Jul. 9, 2014

(65) Prior Publication Data
US 2015/0102304 A1  Apr. 16, 2015

(30) Foreign Application Priority Data

Oct. 11, 2013 (KR) .................. 10-2013-0121465

(51) Int. Cl.
*H01L 51/52* (2006.01)
*H01L 51/56* (2006.01)
*H01L 27/32* (2006.01)

(52) U.S. Cl.
CPC ......... *H01L 51/5246* (2013.01); *H01L 27/3241* (2013.01); *H01L 51/56* (2013.01); *H01L 2251/566* (2013.01)

(58) Field of Classification Search
None
See application file for complete search history.

(56) References Cited

U.S. PATENT DOCUMENTS

| | | | | |
|---|---|---|---|---|
| 2009/0009063 | A1* | 1/2009 | Botelho | H01L 51/5246 313/504 |
| 2009/0068917 | A1* | 3/2009 | Kim | 445/25 |
| 2009/0295277 | A1* | 12/2009 | Logunov | H01L 9/261 313/504 |
| 2010/0008026 | A1* | 1/2010 | Kwon | H01J 9/261 361/679.01 |
| 2010/0013071 | A1* | 1/2010 | Chol et al. | 257/682 |
| 2010/0243627 | A1* | 9/2010 | Lee et al. | 219/121.72 |
| 2011/0014731 | A1* | 1/2011 | Nguyen | H01L 51/5237 438/26 |

(Continued)

FOREIGN PATENT DOCUMENTS

| | | |
|---|---|---|
| JP | 2001-183675 A | 7/2001 |
| JP | 2003297555 A * | 10/2003 |
| KR | 10-1990-0003669 A | 3/1990 |

(Continued)

*Primary Examiner* — Erik Kielin
(74) *Attorney, Agent, or Firm* — Knobbe, Martens, Olson & Bear, LLP

(57) ABSTRACT

A method of cutting an organic light-emitting display panel substrate into OLED display panels is disclosed. In one aspect, the method includes forming a plurality of OLEDs over a lower mother substrate, wherein the OLEDs are divided into a plurality of groups. The method also includes forming a plurality of sealant lines over at least one of an upper mother substrate or the lower mother substrate such that each sealant line surrounds a corresponding group of the OLEDs. The method further includes forming a plurality of assistance sealant lines between adjacent sealant lines, attaching the upper mother substrate to the lower mother substrate with the sealant lines and the assistance sealant lines interposed therebetween, and cutting the upper mother substrate and the lower mother substrate along the assistance sealant lines.

13 Claims, 21 Drawing Sheets

(56) References Cited

U.S. PATENT DOCUMENTS

| | | | |
|---|---|---|---|
| 2011/0241528 A1* | 10/2011 | Choi | 313/317 |
| 2011/0253709 A1* | 10/2011 | Kang et al. | 220/2.1 R |
| 2011/0260607 A1* | 10/2011 | Liu et al. | 313/512 |
| 2012/0104933 A1* | 5/2012 | Jung | H01L 51/5246 313/498 |
| 2013/0009181 A1* | 1/2013 | Daishi et al. | 257/89 |
| 2013/0115460 A1* | 5/2013 | Yamada | 428/402 |
| 2014/0061596 A1* | 3/2014 | Wu | H01L 27/3258 257/40 |
| 2014/0184059 A1* | 7/2014 | Masuda | 313/512 |

FOREIGN PATENT DOCUMENTS

| | | |
|---|---|---|
| KR | 10-2005-0068294 A | 7/2005 |
| KR | 10-0813004 B1 | 3/2008 |

\* cited by examiner

ORGANIC LIGHT-EMITTING DIODE (OLED) DISPLAY PANEL SUBSTRATE AND METHOD OF CUTTING OLED DISPLAY PANELS FROM THE SUBSTRATE

CROSS-REFERENCE TO RELATED APPLICATIONS

This application claims priority to and the benefit of Korean Patent Application No. 10-2013-0121465 filed in the Korean Intellectual Property Office on Oct. 11, 2013, the entire contents of which are incorporated herein by reference.

BACKGROUND

1. Field

The described technology generally relates to an organic light-emitting diode (OLED) display panel and a method of cutting an OLED display panel.

2. Description of the Related Technology

A display device is a device that can display images. Recently, organic light-emitting diode (OLED) displays have been drawing attention due to their unique characteristics.

OLED displays have self-luminous characteristics, and thus, do not require a separate light source, in contrast to liquid crystal displays (LCDs). Accordingly, OLED displays can have a relatively thinner profile and a lighter weight. In addition, OLED displays have high-quality characteristics such as low power consumption, high luminance, fast response speeds, etc.

SUMMARY OF CERTAIN INVENTIVE ASPECTS

One inventive aspect is a method of cutting an OLED display panel that reduces stress applied when cutting the OLED display panel by forming an assistance sealant between sealants of the OLED display panel and cutting the panel according to the assistance sealant region so as to not generate a crack in an incision surface and to minimize the margin required for the cutting, and an OLED display panel manufactured by the cutting method.

Another aspect is a method of cutting an OLED display panel including forming a sealant sealing an upper mother substrate and a lower mother substrate at one of the upper mother substrate and the lower mother substrate and forming an assistance sealant between the adjacent sealants, combining the upper mother substrate and the lower mother substrate by the sealant and the assistance sealant, and cutting the upper mother substrate and the lower mother substrate according to the assistance sealant.

The assistance sealant may decrease stress applied to the sealant when cutting.

The cutting method may further include cleaning the cut panel to remove the assistance sealant.

The cutting method may further include forming a stiffening member at a region where the assistance sealant is removed.

The strength of the formed assistance sealant is lower than the strength of the sealant.

The assistance sealant may be made of a different material from that of the sealant.

The assistance sealant may include more frit than the sealant.

The assistance sealant may be formed of the same material as the sealant and annealing may be performed at a region only corresponding to the assistance sealant.

The assistance sealant may be continuously formed according to a cutting region.

The assistance sealant may be discontinuously formed according to the cutting region.

The assistance sealant may not contact the sealant at the lower mother substrate and may contact the sealant at the upper mother substrate.

The panel cutting may be performed through laser irradiation.

The assistance sealant may be carbonized and removed when cutting the panel.

The cutting method may further include forming a stiffening member at a region where the assistance sealant is removed.

Another aspect is an OLED display panel including a lower substrate, a plurality of OLEDs formed on the lower substrate, a sealant formed according to an outer periphery of the OLEDs, an assistance sealant formed outside the sealant, and an upper substrate, wherein strength of the assistance sealant is lower than that of the sealant.

The assistance sealant may not contact the sealant at the lower substrate and may contact the sealant at the upper substrate.

A stiffening member formed at a position where the assistance sealant is removed may be further included.

The assistance sealant may be continuously formed according to an edge of the OLED display panel.

The assistance sealant may be discontinuously formed according to an edge of the OLED display panel.

Another aspect is a method of forming a plurality of OLED display panels including forming a plurality of OLEDs over a lower substrate, forming a plurality of sealant lines and a plurality of assistance sealant lines over the lower substrate, wherein the sealant lines respectfully surround a plurality of the OLEDs and wherein each of the assistance sealant lines is interposed between adjacent sealant lines, attaching an upper substrate to the lower substrate with the assistance sealant lines formed therebetween, and cutting the upper and lower substrates along the assistance sealant lines.

The method further includes annealing the assistance sealant lines. The method also further includes irradiating the sealant lines and the assistance sealant lines with a laser beam through the upper substrate.

According to at least one embodiment, the method of cutting the OLED display panel includes forming the assistance sealant between the sealants of the panel and cutting the panel according to the assistance sealant region such that the stress applied when cutting is reduced, and thus, the incision surface is not easily broken when cutting and the margin required for the cutting can be minimized.

DETAILED DESCRIPTION OF CERTAIN INVENTIVE EMBODIMENTS

Figure 1:
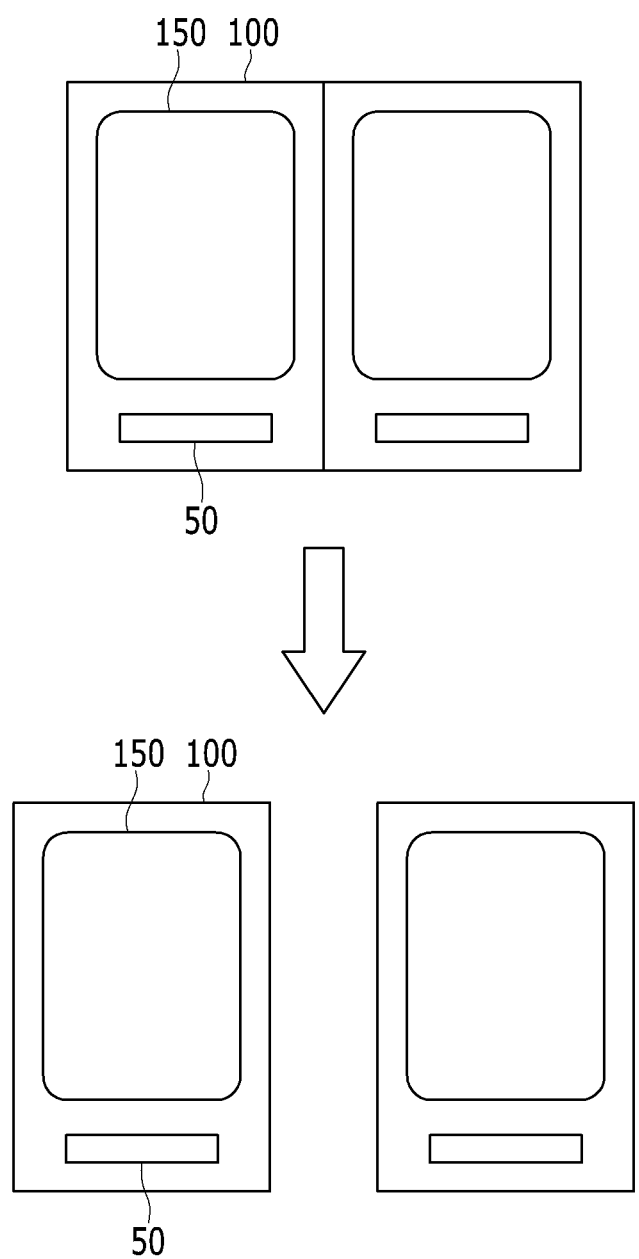
FIG. 1 is a schematic view of a process of cutting a mother substrate including a plurality of OLEDs for separation into individual OLEDs.

The standard OLED display includes a first substrate, OLEDs formed on the first substrate, a second substrate facing the first substrate with the OLEDs interposed therebetween, and a sealant such as frit which attaches and seals the first and second substrates to each other.

The manufacturing of OLED display panels has improved yield by forming a plurality of groups of OLEDs on a lower mother substrate and attaching an upper mother substrate. The mother substrates can be separated into the groups of OLEDs to form a plurality of OLED display panels. Accordingly, the mother substrates must be cut in order to separate the groups of OLEDs. However, the stress generated by the cutting process can result in cracking or other deformations at the incision surface.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A method of cutting an OLED display panel according to an exemplary embodiment will be described with reference to accompanying drawings.

FIG. 1 is a schematic view of a process of cutting a panel including a plurality of OLEDs into individual OLEDs. According to some embodiments, the OLEDs are cutting into groups of OLEDs. The OLED is schematically shown. An OLED 150 is formed on a lower mother substrate 100 and a driver 50 is formed under the OLED 150. As shown in FIG. 1, a plurality of OLEDs are formed on the lower mother substrate 100 and the individual OLED display panels are obtained by cutting the substrate.

Figure 2:
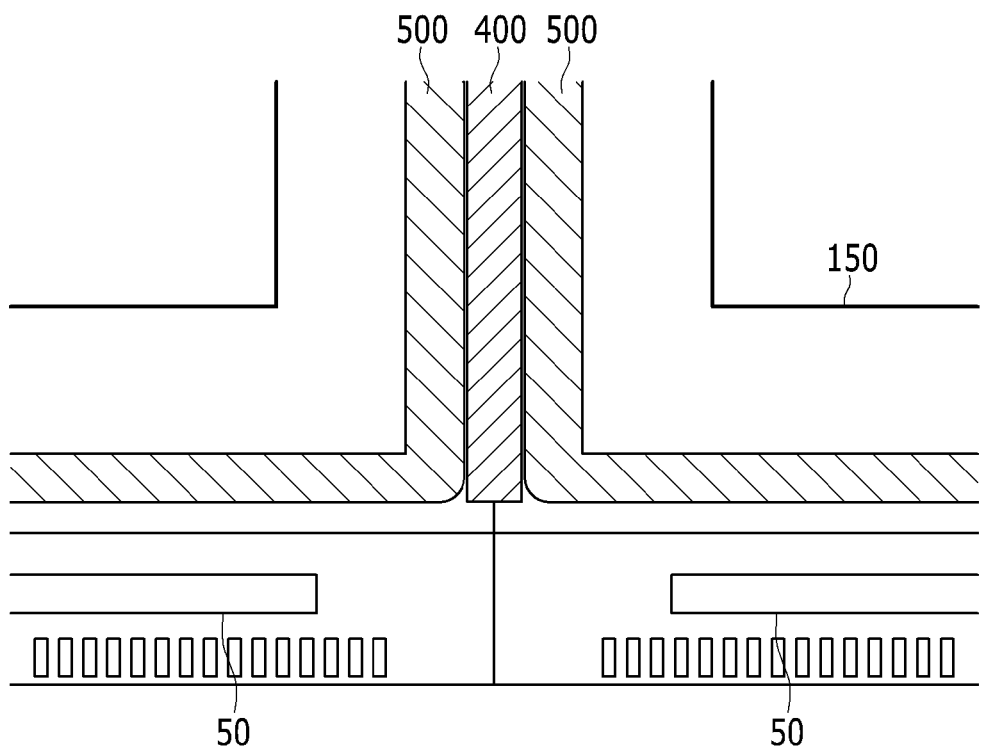
FIG. 2 is an arrangement view of an OLED display panel according to an exemplary embodiment.

FIG. 2 is a layout view of an OLED display panel according to an exemplary embodiment. As shown in FIG. 2, the OLED 150 and the driver 50 are formed on the lower mother substrate. The OLED 150 is formed at the center of the panel and the driver 50 is formed under the OLED 150. At this time, a sealant 500 is formed along the edges of the individual OLEDs or OLED groups 150 and seals the lower mother substrate 100 to an upper mother substrate (not shown).

In the embodiment of FIG. 2, the sealant 500 is described as being formed on the lower mother substrate 100, however the sealant 500 may be formed on the upper mother substrate 200.

The OLED 150 includes a semiconductor layer (not shown) in which a semiconductor, a gate insulating layer, a gate line, a data line, a pixel electrode, etc. are sequentially formed, and an organic light-emitting layer (not shown) formed on the semiconductor layer. The organic light-emitting layer is formed of a plurality of layers including an emission layer and at least of one of a hole-injection layer (HIL), a hole-transporting layer (HTL), an electron-transporting layer (ETL), and an electron-injection layer (EIL).

An assistance sealant 400 is formed at the cutting line at which adjacent OLEDs 150 are cut. That is, as shown in FIG. 2, the assistance sealant 400 is formed between the sealants 500 enclosing the edges of the individual OLEDs 150.

Figure 3:
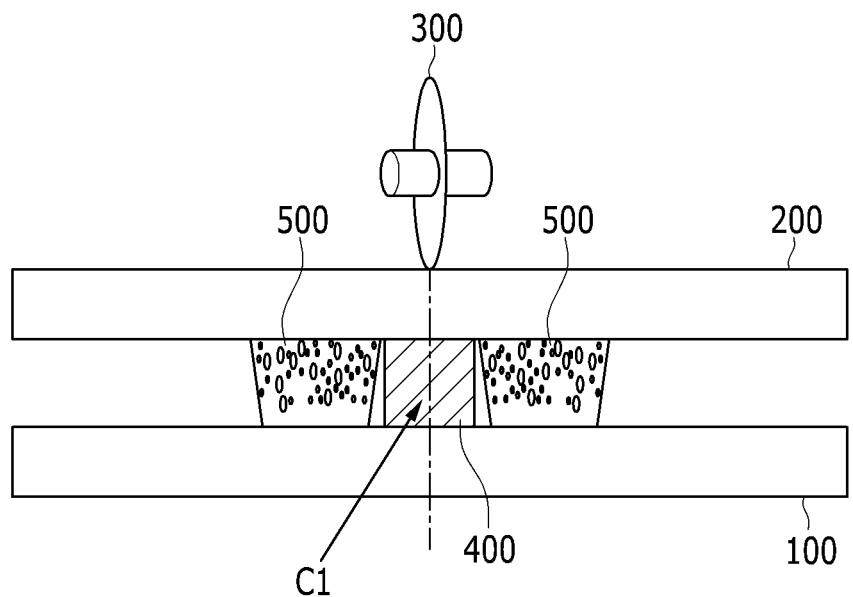
FIG. 3 is a cross-sectional view of cutting an OLED display panel according to an exemplary embodiment.
Figure 4:
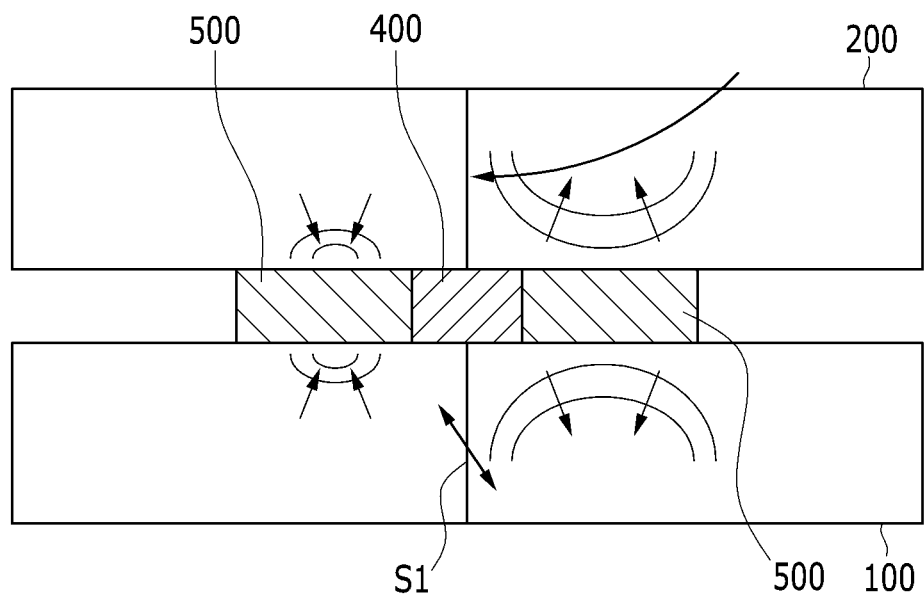
FIG. 4 is a view showing the stress generated when cutting an OLED display panel according to an exemplary embodiment.

FIG. 3 is a cross-sectional view illustrating the cutting of an OLED display panel according to an exemplary embodiment. FIG. 4 is a view showing the stress applied when cutting an OLED display panel according to an exemplary embodiment.

Referring to FIG. 3, the sealant 500 is formed between the lower mother substrate 100 and the upper mother substrate 200 and each OLED or OLED groups is surrounded by sealant 500. The assistance sealant 400 is formed between the adjacent sealants 500. When performing the cutting, the cutting line C1 overlaps the assistance sealant 400 and the assistance sealant 400 is also cut when performing the cutting. When cutting the panel, the assistance sealant is also cut, so the stress applied to each panel and the sealant is minimized.

Figure 10:
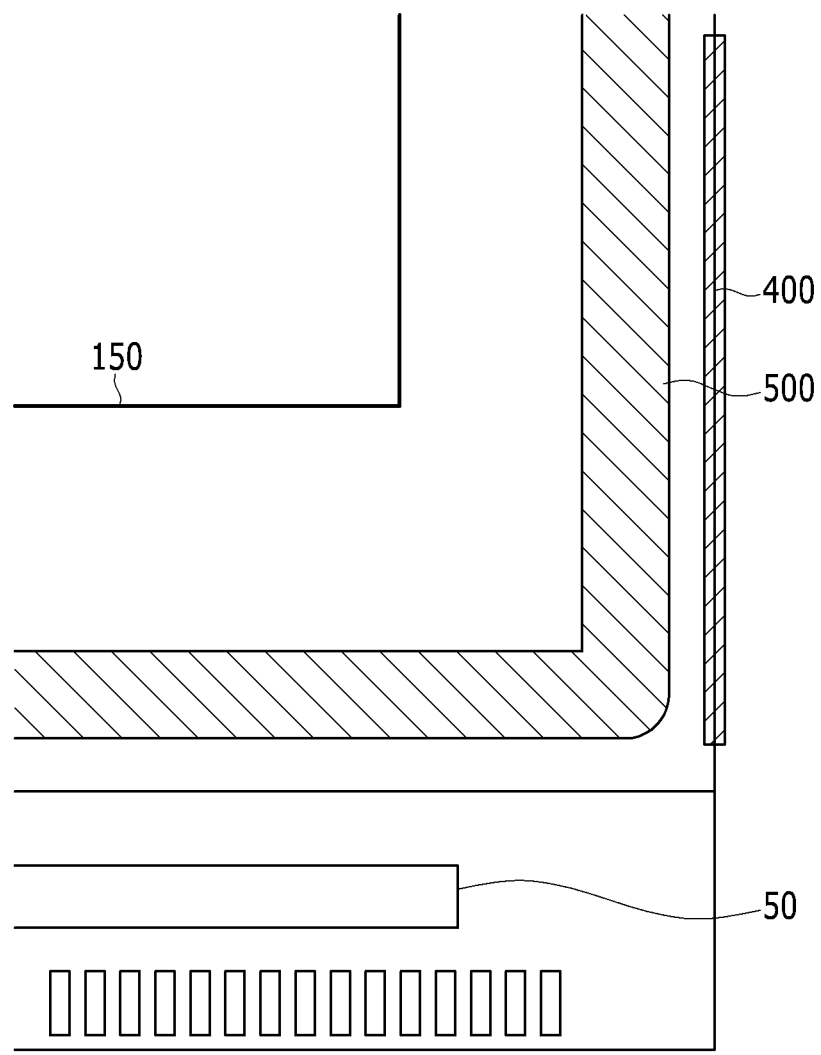
FIGS. 10 to 12 are views showing various shapes of the assistance sealants according to exemplary embodiments.
Figure 11:
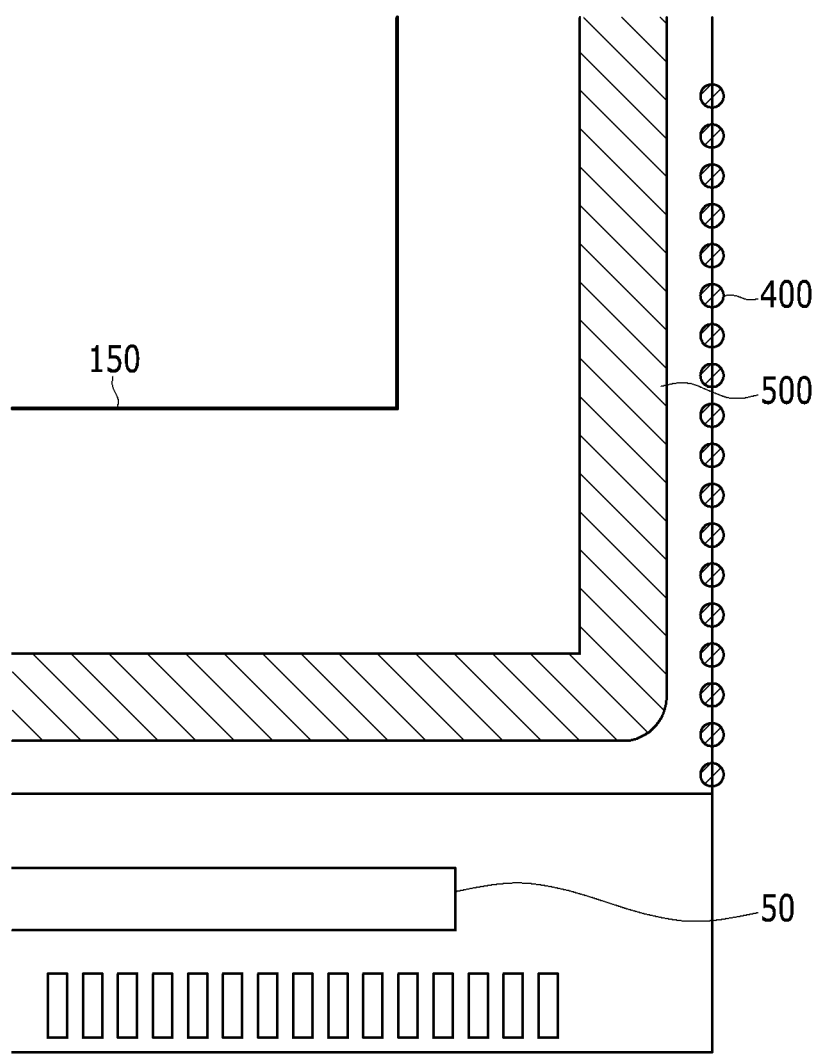
Figure 12:
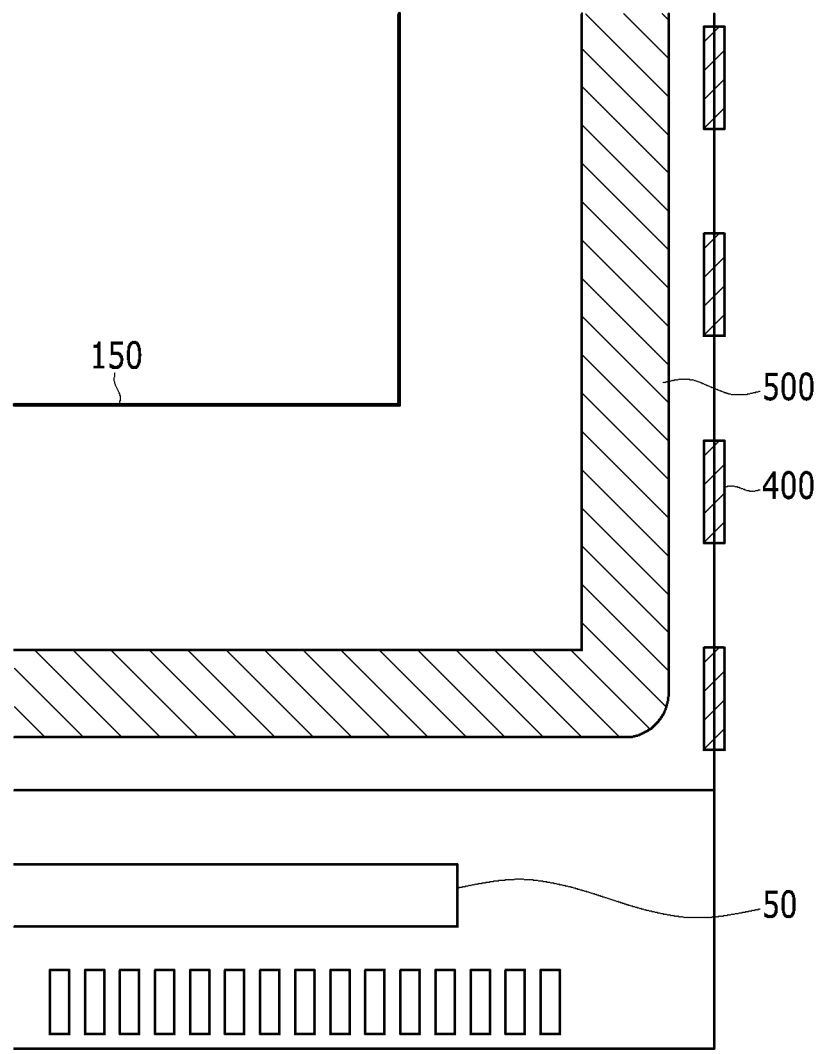

The assistance sealant 400 may be continuously formed along the cutting line or may be discontinuously formed along the cutting line. FIG. 10 to FIG. 12 are views showing the shape of the assistance sealant 400 according to exemplary embodiments. As shown in FIG. 10, the assistance sealant may be formed with a continuous straight line shape along the cutting line. Also, as shown in FIG. 11, the assistance sealant may be formed with a discontinuous circular shape along the cutting line. Further, as shown in FIG. 12, the assistance sealant may be formed with a discontinuous straight line shape along the cutting line.

The assistance sealant is formed of a material having lower strength than the sealant. The material of the assistance sealant can be the same as or different from that of the sealant. When the material of the assistance sealant is the same as that of the sealant, after forming the sealant and the assistance sealant, the strength of the assistance sealant may be weakened by annealing only the assistance sealant. When annealing the assistance sealant, the crystalline structure of the assistance sealant is changed to an amorphous structure, and thus, the strength is weakened.

Also, the assistance sealant may be formed of a different material from that of the sealant. When the assistance sealant is formed of a different material from that of the sealant, the assistance sealant may include more frit when compared to the sealant. As the frit content increases, the melting point of the material is decreases and the strength is weakened accordingly.

The assistance sealant may be formed to be spaced apart from the sealant and may partially contract. When the assistance sealant partially contacts, the assistance sealant may not contact the sealant at the lower mother substrate but may only contact the sealant at the upper mother substrate. When the assistance sealant only contacts the sealant at the upper mother substrate, since the assistance sealant does not contact the sealant near the lower mother substrate, the cutting pressure applied to the assistance sealant is not transmitted to the sealant when performing the cutting. Also, since the assistance sealant and the sealant are in contact with each other, cracks caused by a cutting line error may be prevented. A detailed formation process for forming the described assistance sealant will be described later.

FIG. 4 shows the stress when cutting an OLED display panel according to an exemplary embodiment. In FIG. 4, the arrows represent the direction in which the stress is applied and the number of curved lines pictured near the arrows represents the magnitude of the stress. S1 of FIG. 4 represents the stress applied between the two panels that are divided by the cutting.

Figure 5:
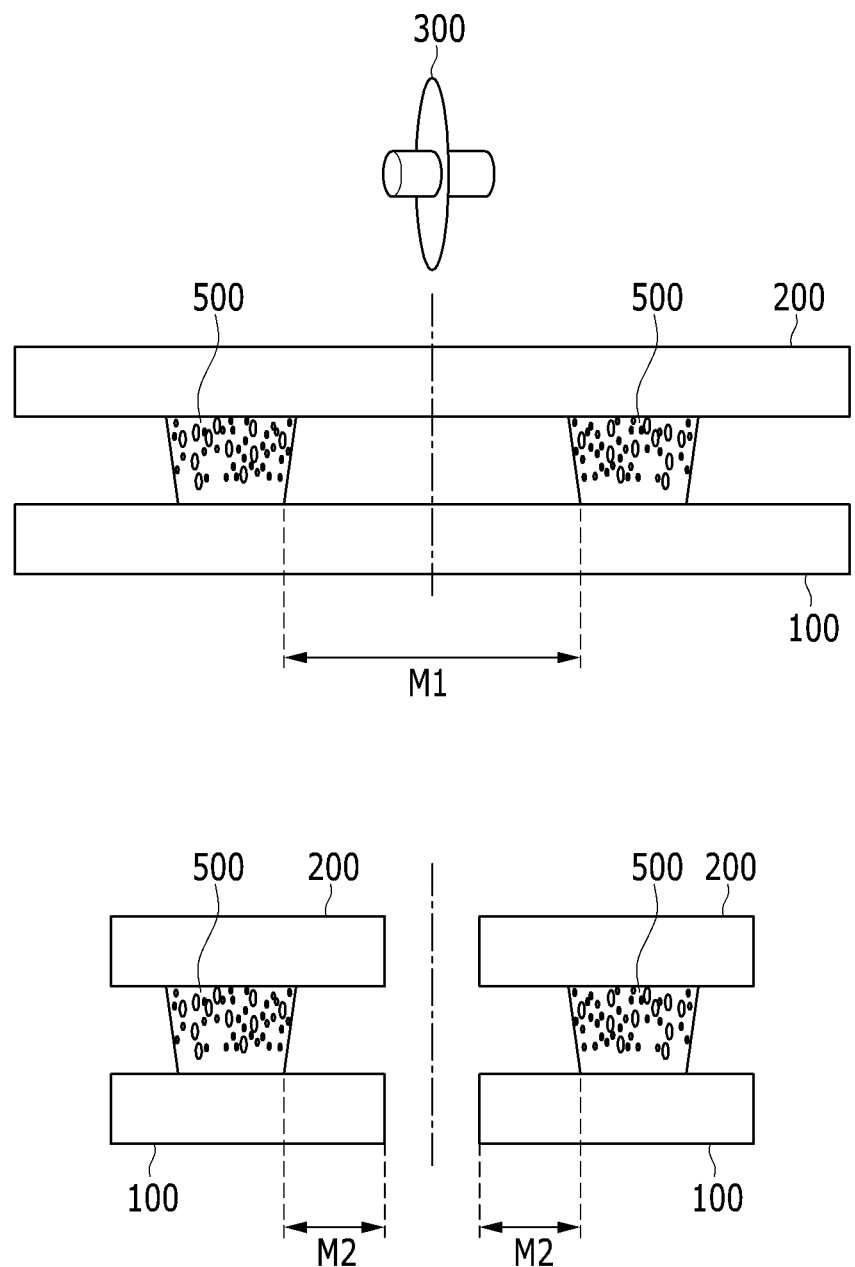
FIG. 5 is a cross-sectional view of cutting an OLED display panel according to a comparative example.
Figure 6:
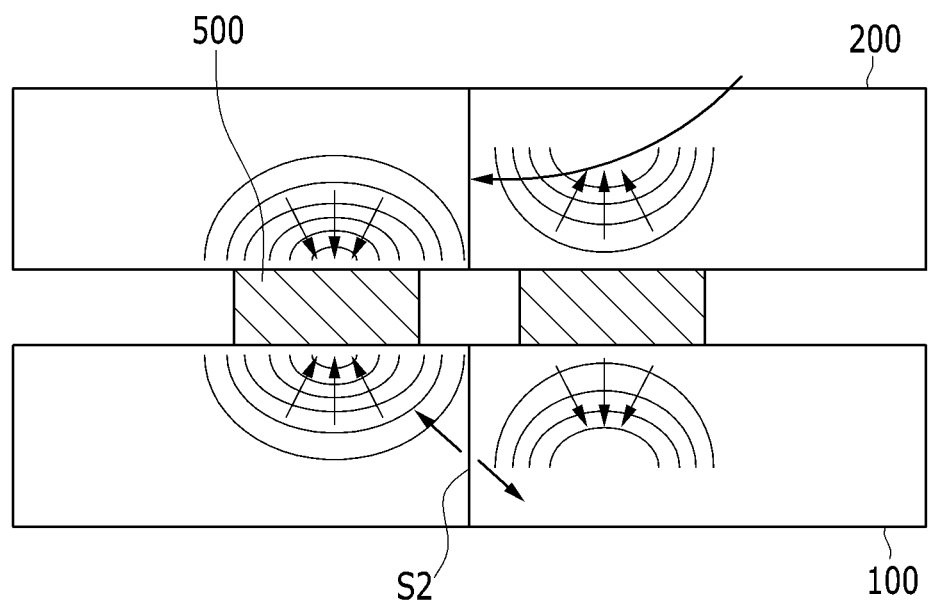
FIG. 6 is a view showing the stress generated when cutting an OLED display panel according to a comparative example.

FIG. 5 is a cross-sectional view of cutting an OLED display panel according to a comparative example. FIG. 6 is a view showing stress when cutting the OLED display panel according to the comparative example. Referring to FIG. 5, when cutting the OLED display panel of the comparative example, a void is formed between the upper mother substrate and the lower mother substrate in the region where a cutting wheel 300 passes. Accordingly, the stress generated when cutting the panel is entirely transmitted to the upper mother substrate and the lower mother substrate.

FIG. 6 shows the stress applied when performing the cutting. The arrows represent the direction in which the stress is applied and the number of curved lines pictured near the arrow represents the magnitude of the stress. S2 of FIG. 6 represents the stress applied between the two panels that are divided by the cutting. The OLED display panel according to the comparative example does not include the material that decreases the stress to the cutting line, and thus, the stress applied by the cutting wheel is entirely transmitted to the panel. Accordingly, S2 shown in FIG. 6 is larger than S1 shown in FIG. 4.

That is, in the cutting of the OLED display panel according to an exemplary embodiment, the assistance sealant 400 is formed between the lower mother substrate 100 and the upper mother substrate 200 in the cutting region thereby absorbing the stress applied to the upper and lower substrates when cutting. Accordingly, damage to incision surface caused by the cutting stress may be prevented.

Figure 7:
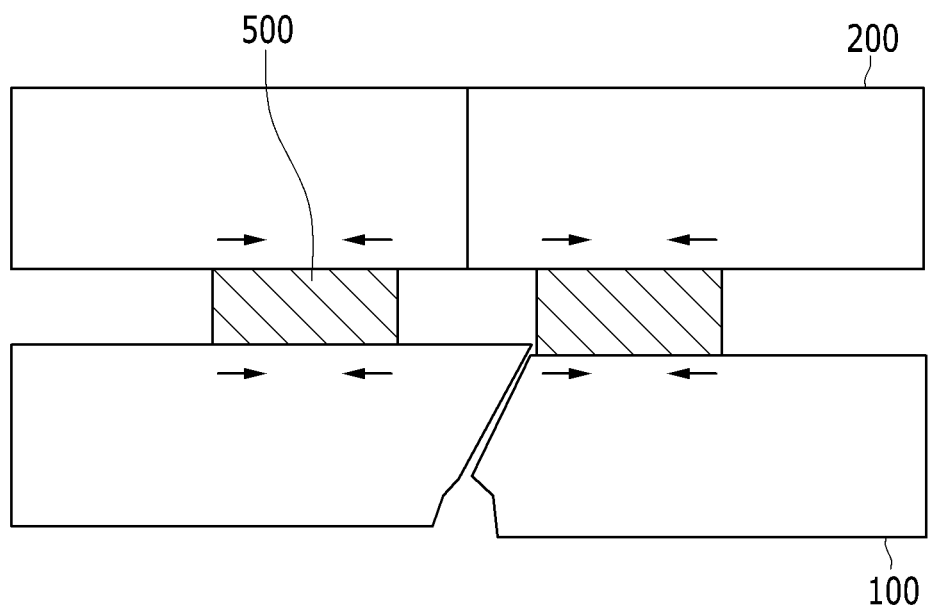
FIG. 7 is a view showing a crack in an incision surface when cutting an OLED display panel according to a comparative example.

FIG. 7 shows a crack in the incision surface when cutting the OLED display panel according to the comparative example. As described above, the OLED display panel according to the comparative example includes a void between the upper and lower substrates over which the cutting wheel is passed, and thus, the stress applied by the cutting wheel is entirely transmitted to the panel. Accordingly, as shown in FIG. 7, the cutting is not desirably performed in the comparative example because of the stress applied at the cutting line forms the crack at the end of the incision surface. Because of the possibility of cracks along the cutting line, the OLED display panel according to the comparative example must include a sufficient margin around to cutting line to prevent damage from generated cracks. As the distance between the sealant and the cutting line decreases, the possibility of crack generation increases. Consequently, a minimum distance between the sealant and the cutting line must be maintained. This is designated by M1 and M2 in FIG. 5.

However, in the cutting of the OLED display panel according to at least one embodiment, the assistance sealant absorbs the stress applied to the panel when cutting such that an additional cutting margin for preventing cracks is not required. Accordingly, spatial optimization of the panel can be realized.

Next, the cutting of the OLED display panel according to an exemplary embodiment will be described with reference to FIG. 8A to FIG. 8E. FIG. 8A to FIG. 8E are views sequentially showing a cutting process of an OLED display panel according to an exemplary embodiment.

Figure 8A:
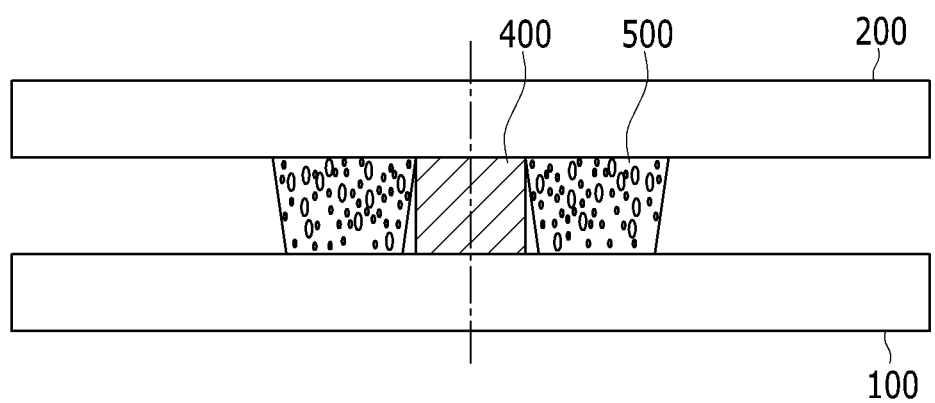
FIG. 8A to FIG. 8E are views sequentially showing a cutting process of an OLED display panel according to an exemplary embodiment.

Firstly, referring to FIG. 8A, the assistance sealant 400 is formed between the parallel sealants 500 formed between the lower mother substrate 100 and the upper mother substrate 200. The region where the assistance sealant 400 is formed is in the same region where the cutting wheel passes. In FIG. 8A, the cutting line where the cutting wheel passes is indicated by a dot-dash line.

The assistance sealant 400 has lower strength than the sealant 500. The material of the assistance sealant 400 may be the same as or different than that of sealant 500.

When the assistance sealant 400 is formed of the same material as that of the sealant 500, the strength of the assistance sealant 400 may be weakened by annealing only the assistance sealant 400. That is, after forming the sealant 500 and the assistance sealant 400 between the substrates, a laser is irradiated to the sealant 500 and the assistance sealant 400 to harden them. Next, only the assistance sealant 400 is additionally annealed such that the crystalline structure of the assistance sealant 400 is changed from to an amorphous structure. The degree of change to the amorphous structure may be appropriately controlled according to the degree of annealing performed. The amorphous material has weaker strength compared with the crystalline material, and thus, the strengths may be different between the assistance sealant 400 and the sealant 500 even though they are formed of the same material.

Also, the strengths may be controlled by differentiating the components of the assistance sealant 400 and the sealant 500. That is, compared with the sealant 500, the frit content of the assistance sealant 400 may be increased. The melting point of the assistance sealant 400 including the additional frit is decreased and the strength thereof is decreased compared with the sealant 500.

The assistance sealant 400 is formed between the sealants 500, however the assistance sealant 400 and the sealant 500 may partially contact or may not contact each other. When the assistance sealant 400 and the sealant 500 contact each other, the sealant 500 and the assistance sealant 400 may not contact at the lower mother substrate 100 and the sealant 500 and the assistance sealant 400 may contact at the upper mother substrate 200.

Figure 13A:
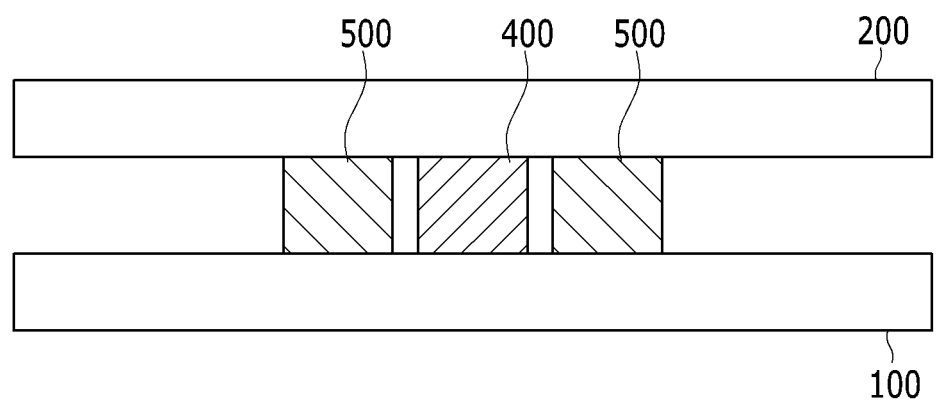
FIG. 13A and FIG. 13B are views showing a formation process of an assistance sealant according to an exemplary embodiment.
Figure 13B:
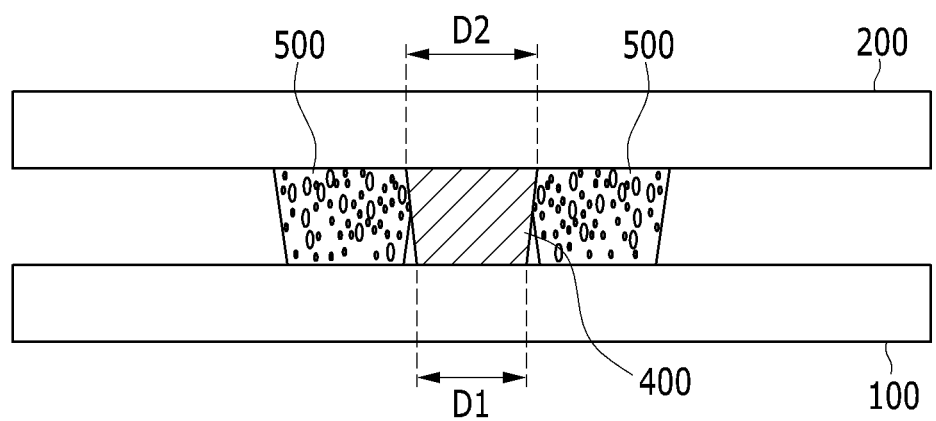

FIG. 13B is a view showing the formation of an assistance sealant 400 and a sealant 500 according to an exemplary embodiment. As shown in FIG. 13B, the assistance sealant may not contact the sealant 500 at the lower mother substrate 100 and may contact the sealant 500 at the upper mother substrate 200. That is, the assistance sealant may have a trapezoidal shape having a smaller bottom area than the top area.

As described above, when the assistance sealant and the sealant only contact at the upper mother substrate, since the assistance sealant and the sealant do not contact each other near the lower mother substrate, the cutting pressure applied to the assistance sealant is not transmitted to the sealant when cutting.

Also, since the assistance sealant and the sealant are close to each other at the upper side, cracks caused by cutting line error may be prevented. That is, when the assistance sealant and the sealant do not contact at the upper side as in the comparative example, a void is formed between the assistance sealant and the sealant. The cutting wheel may be slip into the space between the assistance sealant and the sealant due to a process error.

When the assistance sealant is not formed in the region where the cutting wheel passes, the assistance sealant does not reduce the stress produced during the cutting and a crack may be formed in the substrate. However, as shown in FIG. 13B, when the sealant 500 and the assistance sealant 400 contact at the upper mother substrate 200, the above problem can be prevented.

One embodiment of the process of forming the assistance sealant 400 to be spaced apart from the sealant 500 at the lower mother substrate 100 and contact the sealant 500 at the upper mother substrate 200 is as shown in FIG. 13B.

As shown in FIG. 13A, the material forming the assistance sealant 400 is formed between the sealant 500 with a predetermined distance therebetween. Next, a laser is irradiated from the upper mother substrate 200 for hardening the assistance sealant 400 and the sealant 500. The power of the irradiated laser is highest at its center and is gradually decreased closer to both edges. Accordingly, as seen in FIG. 13B, the materials of the sealant 500 and the assistance sealant 400 are hardened and spread by the difference in the power near the upper mother substrate close to the laser D2. However, the assistance sealant is formed to have a trapezoidal shape D1 being relatively narrowly spread at the lower mother substrate due to the power difference of the laser between the upper and lower mother substrates.

The assistance sealant 400 may be continuously formed along to the cutting line or may be discontinuously formed according to the cutting line. FIG. 10 to FIG. 12 are views showing the shape of an assistance sealant 400 according to exemplary embodiments. As shown in FIG. 10, the assistance sealant may be formed with a continuous straight line shape along the cutting line. Also, as shown in FIG. 11, the assistance sealant may be formed with a discontinuous circular shape along the cutting line. Further, as shown in FIG. 12, the assistance sealant may be formed with a discontinuous straight line shape along the cutting line.

Figure 8B:
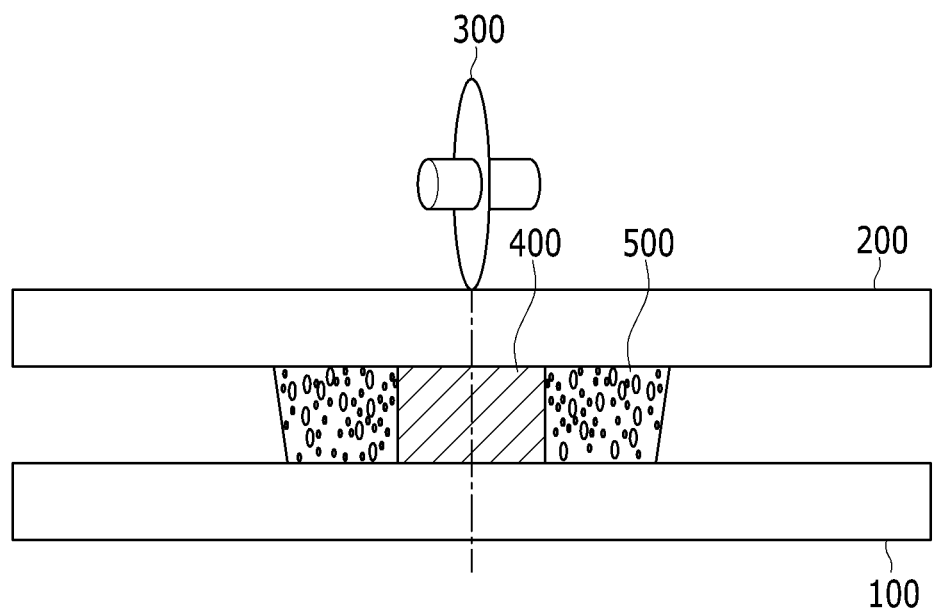
Figure 8C:
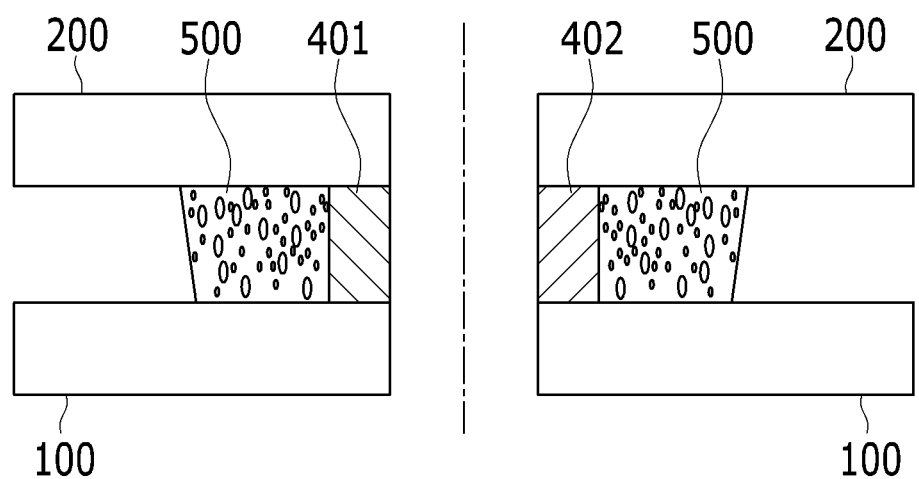

FIG. 8B and FIG. 8C show a step of cutting the panel including the assistance sealant along to the assistance sealant and a divided cross-sectional view of the panel after the cutting process. As shown in FIG. 8B, the panel is cut along the region where the assistance sealant is formed. The panel may be physically cut by the cutting wheel or may be cut by laser irradiation.

The larger panel including a plurality of OLEDs is divided into the individual OLED display panels by the cutting process. When performing the cutting, the assistance sealant 400 is also cut and assistance sealants 401 and 402 are respectively formed along the cut individual OLED display panels. Since the strength of the assistance sealant 400 is less than that of the sealant 500, when the assistance sealant 400 is cut, the pressure or the crack is not transmitted to the sealant 500 and is only transmitted to the assistance sealant 400.

Figure 8D:
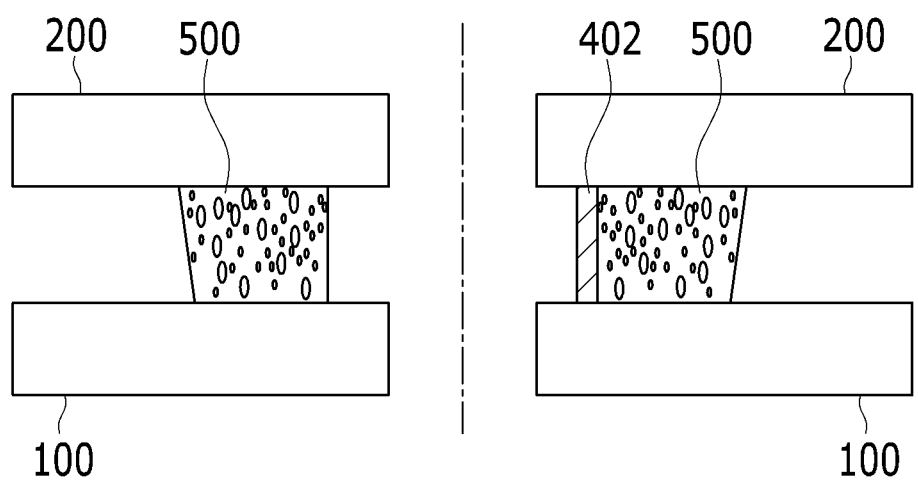

FIG. 8D shows a step of cleaning the cut OLED display panels. When cleaning the cut individual OLED display panels, the cut assistance sealants 401 and 402 may be completely or partially removed.

Figure 8E:
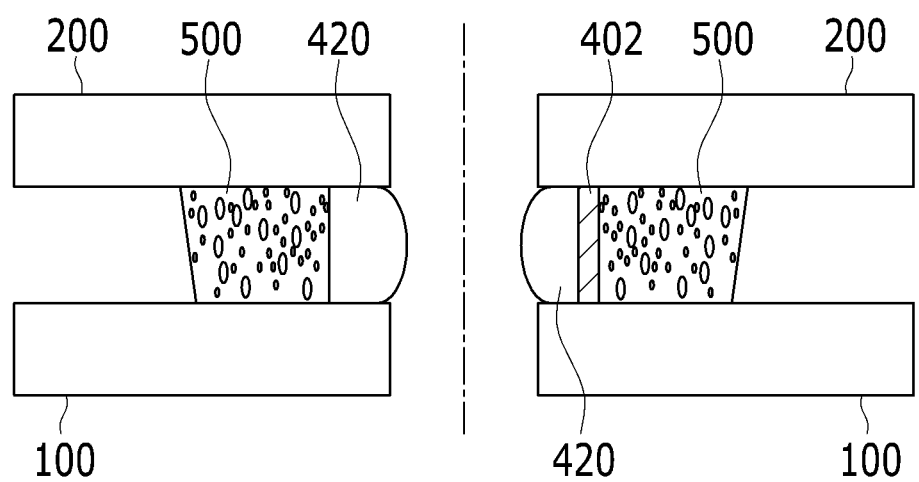

FIG. 8E is a view showing a process of forming a stiffening member 420 at the region where the assistance sealant is removed. The stiffening member 420 may be formed at the region where the assistance sealant 400 is completely removed or it may be formed even if the assistance sealant 400 is not completely removed and partially remains. The stiffening member prevents damage to the substrate by filling the space between the upper mother substrate 200 and the lower mother substrate 100.

According to some embodiments, the stiffening member 420 may not be formed and the cutting process may be finished after the assistance sealant 400 is removed.

The cutting of an OLED display panel according to another exemplary embodiment will be described with reference to FIG. 9A to FIG. 9D. FIG. 9A to FIG. 9D are views sequentially showing a cutting process of an OLED display panel according to another exemplary embodiment.

The cutting of the OLED display panel according to the present exemplary embodiment is similar to the cutting of the OLED display panel according to the embodiment shown in FIG. 8. A detailed description of similar constituent elements is omitted.

Figure 9A:
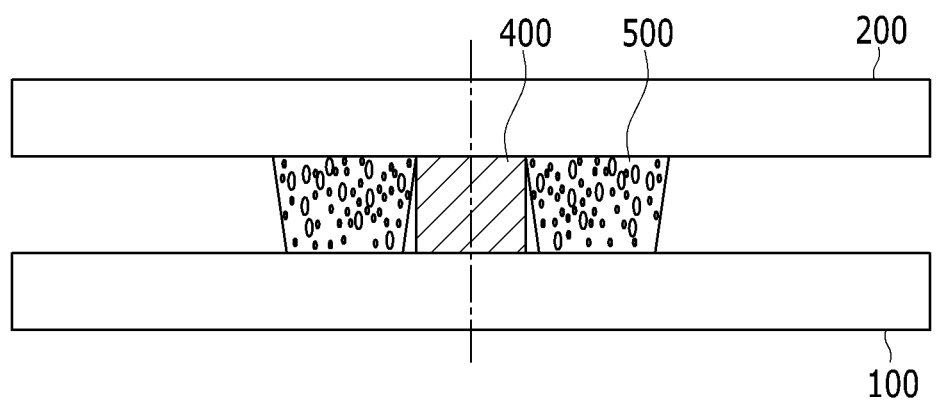
FIG. 9A to FIG. 9D are views sequentially showing a cutting process of an OLED display panel according to another exemplary embodiment.

FIG. 9A is a view in which the assistance sealant 400 is formed between the substantially parallel sealants 500 and between the lower and upper mother substrates 100 and 200. The assistance sealant 400 is formed in the region where the cutting wheel passes. A detailed description related to the formation of the assistance sealant is the same as in the previous embodiments.

The assistance sealant 400 has lower strength than the sealant 500. The material of the assistance sealant 400 may be the same as or different than that of the sealant 500.

When the assistance sealant 400 is formed of the same material as that of the sealant 500, the strength of the assistance sealant 400 may be weakened by annealing only the assistance sealant 400.

Also, the strengths of the assistance sealant 400 and sealant 500 may be controlled by differentiating the components of the assistance sealant 400 and the sealant 500. That is, the frit content of the assistance sealant 400 may be increased when compared to that of the sealant 500. The melting point of the assistance sealant 400 including the additional frit is decreased and the strength thereof is decreased compared to the sealant 500.

The assistance sealant 400 is formed between the sealants 500 and the assistance sealant 400 and the sealant 500 may either partially contact or not contact each other. When the assistance sealant 400 and the sealant 500 contact each other, the sealant 500 and the assistance sealant 400 are spaced apart at the lower mother substrate 100 while contacting each other at the upper mother substrate 200.

Figure 9B:
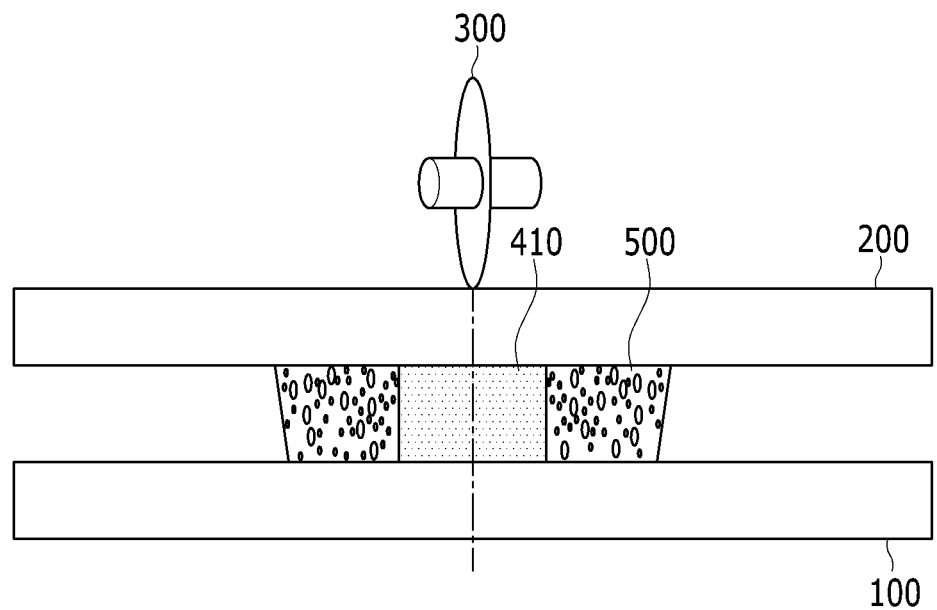

FIG. 9B is a view showing the configuration of an assistance sealant 400 and a sealant 500 according to an exemplary embodiment. As shown in FIG. 9B, the assistance sealant contacts the sealant 500 at the lower mother substrate 100 and at the upper mother substrate 200. That is, the assistance sealant may have parallel sides.

The assistance sealant 400 may be continuously formed along the cutting line or may be discontinuously formed along the cutting line. FIG. 10 to FIG. 12 are views showing the shape of an assistance sealant 400 according to other exemplary embodiments. As shown in FIG. 10, the assistance sealant 400 is formed with a continuous straight line along the cutting line. Also, in the embodiment of FIG. 11, the assistance sealant is formed with a discontinuous circular shape along the cutting line. Further, as shown in the embodiment of FIG. 12, the assistance sealant is formed with a discontinuous straight line along the cutting line.

Figure 9C:
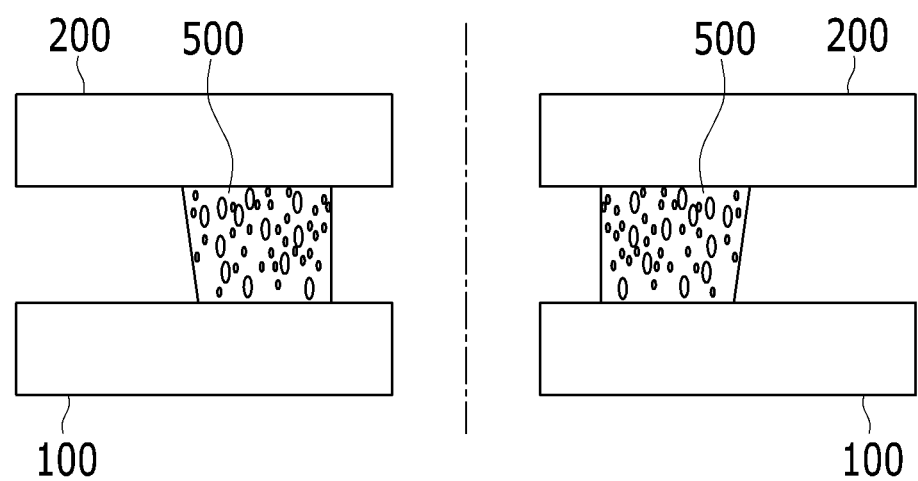

FIG. 9B and FIG. 9C show a step of cutting the panel including the assistance sealant along the assistance sealant and a divided cross-sectional view of the panel after the cutting. As shown in FIG. 9B, the panel is cut in the region where the assistance sealant is formed.

The panel is cut through the laser irradiation. That is, a laser having sufficient power to cut the panel is applied to the region where the assistance sealant is formed. At this time, the panel is cut through the laser irradiation and the assistance sealant 400 is also carbonized and removed due to the power of the laser. That is, since the assistance sealant has a weaker strength than the sealant, it is carbonized by the laser irradiation applied to cut the panel, thereby being easily removed. FIG. 9C shows that the assistance sealant 410 is carbonized and eliminated after the cutting step. Thus, an additional process to remove the assistance sealant is not required. Accordingly, the cutting process may be simplified by one step.

Figure 9D:
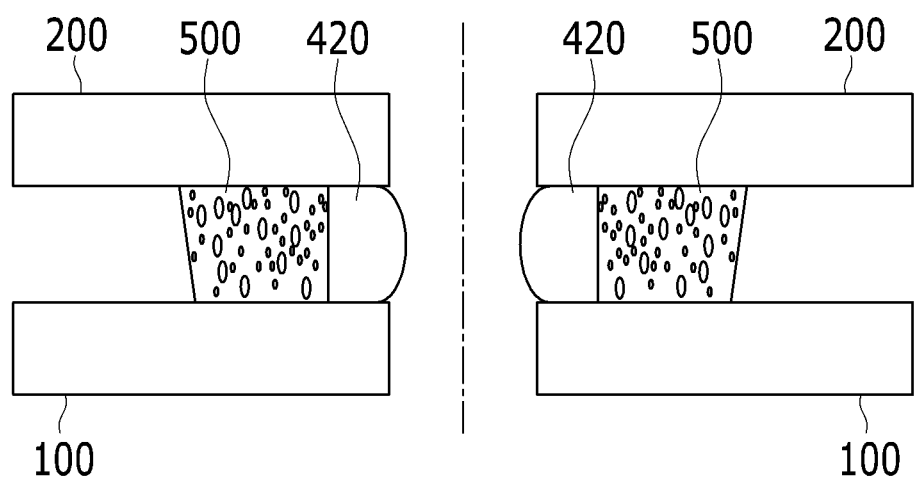

FIG. 9D is a view of a process of forming the stiffening member 420 at the region where the assistance sealant is removed. The stiffening member prevents damage to the substrate by filling the space between the upper mother substrate 200 and the lower mother substrate 100.

According to some embodiments, the stiffening member 420 is not formed and the cutting process is completed after the assistance sealant 400 is removed.

Next, the OLED display panel formed by the cutting process will be described. The OLED display panel according to an exemplary embodiment may include the lower substrate, the plurality of OLEDs formed on the lower substrate, the sealant formed along the outer perimeter of the OLEDs, the assistance sealant formed outside the sealant, and the upper substrate. The strength of the assistance sealant is less than that of the strength of the sealant 500.

The material of the assistance sealant 400 may be the same as or different from that of the sealant 500.

The assistance sealant 400 and the sealant 500 may partially contact or may not contact. According to some embodiments, the assistance sealant 400 and the sealant 500 contact, they may contact at the upper substrate 200 but not at the lower substrate 100.

The assistance sealant 400 is formed along the outermost edge of each OLED display panel. The assistance sealant may be continuously formed at the outermost edge of the individual OLED display panel. Alternatively, the assistance sealant may be discontinuously formed along the outermost edge of the individual OLED display panel.

The OLED display panel according to another exemplary embodiment includes the lower substrate, the plurality of OLEDs formed on the lower substrate, the sealant formed along the outermost edge of the OLEDs, the stiffening member formed outside the sealant, and the upper substrate.

The stiffening member may be formed at the region where the assistance sealant has been removed from. When the assistance sealant is not completely removed, the assistance sealant may be formed to contact the remaining assistance sealant.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of cutting an organic light-emitting diode (OLED) display panel, comprising:
    forming a plurality of OLEDs over a lower mother substrate, wherein the OLEDs are divided into a plurality of groups;
    forming a plurality of sealant lines over at least one of an upper mother substrate or the lower mother substrate such that each sealant line surrounds a corresponding group of the OLEDs;
    forming a plurality of assistance sealant lines, each of which is formed between two neighboring sealant lines;
    attaching the upper mother substrate to the lower mother substrate with the sealant lines and the assistance sealant lines;
    irradiating each of the assistance sealant lines together with the two neighboring sealant lines via a laser, wherein each of the assistance lines and the two neighboring sealant lines are irradiated with light having a power that gradually decreases from a center axis of the light to the edge of the light; and
    cutting the upper mother substrate and the lower mother substrate along the assistance sealant lines,
    wherein each of the assistance sealant lines is formed to: i) be spaced apart from the two neighboring sealant lines adjacent to the lower mother substrate and ii) contact the two neighboring sealant lines adjacent to the upper mother substrate,
    wherein the assistance sealant lines are formed of a different material than that of the sealant lines, and
    wherein the sealant lines include frit and each of the assistance sealant lines includes more frit than each of the sealant lines.

2. The method of claim 1, wherein each of the assistance sealant lines is configured to decrease the stress applied to the sealant lines during the cutting.

3. The method of claim 1, further comprising cleaning the cut panels to remove the assistance sealant lines.

4. The method of claim 3, further comprising forming a stiffening member in a region where the assistance sealant lines have been removed from.

5. The method of claim 1, wherein the strength of each of the assistance sealant lines is less than that of each of the sealant lines.

6. The method of claim 1, wherein the cutting comprises irradiating a laser beam along the assistance sealant lines.

7. The method of claim 6, wherein the cutting further comprises carbonizing and removing the assistance sealant lines.

8. The method of claim 7, further comprising forming a stiffening member in a region where the assistance sealant lines have been removed from.

9. The method of claim 1, wherein the assistance sealant lines are formed together as a single, continuous line along a cutting region.

10. The method of claim 1, wherein each of the assistance sealant lines is discontinuously formed along a cutting region.

11. The method of claim 1, wherein each of the assistance sealant lines has a cross-section having a substantially trapezoidal shape.

12. A method of forming a plurality of organic light-emitting diode (OLED) display panels, comprising:
    forming a plurality of OLEDs over a lower substrate;
    forming a plurality of sealant lines and a plurality of assistance sealant lines over the lower substrate, wherein the sealant lines respectively surround a plurality of the OLEDs and wherein each of the assistance sealant lines is interposed between two neighboring sealant lines;
    attaching an upper substrate to the lower substrate with the assistance sealant lines formed therebetween;
    irradiating each of the assistance sealant lines together with the two neighboring sealant lines via a laser, wherein each of the assistance lines and the two neighboring sealant lines are irradiated with light having a power that gradually decreases from a center axis of the light to the edge of the light; and cutting the upper and lower substrates along the assistance sealant lines,
wherein each of the assistance sealant lines is formed to: i) be spaced apart from the two neighboring sealant lines adjacent to the lower substrate and ii) contact the two neighboring sealant line adjacent to the upper substrate,
wherein the assistance sealant lines are formed of a different material than that of the sealant lines, and
wherein the sealant lines include frit and each of the assistance sealant lines includes more frit than each of the sealant lines.

13. The method of claim 12, wherein each of the assistance sealant lines has a cross-section having a substantially trapezoidal shape.

\* \* \* \* \*